July 12, 1960 K. C. MacKAY 2,944,329

TERMINAL CLIP STRUCTURE

Filed July 11, 1955 2 Sheets-Sheet 1

INVENTOR.
Kenneth C. MacKay
BY: Olson & Trexler
Attys.

July 12, 1960 K. C. MacKAY 2,944,329

TERMINAL CLIP STRUCTURE

Filed July 11, 1955 2 Sheets-Sheet 2

INVENTOR.
Kenneth C. MacKay
BY: Olson & Trexler
Attys.

United States Patent Office 2,944,329

Patented July 12, 1960

2,944,329

TERMINAL CLIP STRUCTURE

Kenneth C. MacKay, Park Ridge, Ill., assignor to Illinois Tool Works, Chicago, Ill., a corporation of Illinois Filed July 11, 1955, Ser. No. 521,145

6 Claims. (Cl. 29—193.5)

The present invention relates to novel terminal clips for receiving wires, electronic tube prongs and the like and to a novel method for mounting such clips.

While various applications for the present invention will suggest themselves, the invention may be conveniently described as it relates to the production of radio or television chassis or other electronic equipment. In the highly competitive radio and television industry, efforts are continuously being made to reduce manufacturing costs. Thus, the use of printed circuits in chassis has been widely adopted. As will be understood, a chassis incorporating a printed circuit includes a panel of plastic or other suitable insulating material on which elements of the circuit are printed with copper or the like. In order to mount tubes on such a panel, it has heretofore been the practice to provide a terminal clip for each prong of the tube. Such clips have previously been formed and mounted on the panel separately, and since the tubes have a number of prongs, it is readily apparent that a considerable amount of time and labor is required to mount such clips on the panel.

Terminal clips heretofore proposed have included a finger adapted to be inserted through an aperture in the panel and a socket portion for receiving a prong of a tube, which socket portion also extends through another aperture in the panel. In order to connect the clip finger with an element of the printed circuit, the panel is lowered to a bath of molten solder so that the finger is dipped into the solder. One difficulty which has been encountered during the dip soldering operation is that the end of the socket portion of the clip may be closed by the solder so that the socket could no longer receive the prong of a tube. In order to overcome this difficulty, it has heretofore been the practice to shield the end of the clip socket portion with wax or the like so as to prevent the solder from adhering thereto. It will be appreciated that the labor and material required for shielding the end of the clip socket portion increases the manufacturing cost of the chassis.

An important object of the present invention is to provide a novel terminal clip structure and a novel method for applying the clip structure through a panel whereby substantial savings in time and labor may be effected.

A more specific object of the present invention is to provide a novel terminal clip structure and method for mounting the same whereby a plurality of clip elements for receiving a plurality of tube prongs or the like may be easily and simultaneously mounted on a panel.

A further object of the present invention is to provide a novel terminal clip which is constructed so as to have a socket portion formed so as substantially to eliminate any possibility of being closed by solder during dip soldering of a finger portion of the clip.

Another object of the present invention is to provide a novel sheet material terminal clip which is of simple and economical construction and which may readily receive and securely hold a terminal wire or prong.

Other objects and advantages of the present invention will become apparent from the following description and the accompanying drawings wherein:

Fig. 8 is an elevational view showing a chassis including the novel terminal clips of the present invention;

Fig. 9 is a fragmentary plan view of a printed circuit panel having the novel terminal clips of this invention mounted thereon;

Fig. 10 is an enlarged fragmentary sectional view taken along line 10—10 in Fig. 9;

Fig. 11 is a perspective view of a clip element embodying the principles of this invention and shows the manner in which the clip receives the prong of a tube or the like;

Fig. 12 is a sectional view similar to Fig. 10 but showing how the terminal clips may be applied from the bottom of the panel;

Fig. 13 is a fragmentary perspective view showing a clip structure embodying a modified form of the present invention;

Fig. 14 is a fragmentary sectional view showing an assembly including a clip element of Fig. 13;

Fig. 15 is a fragmentary perspective view showing another modified form of the present invention; and Fig. 16 is a fragmentary sectional view showing an assembly including a clip shown in Fig. 15.

Figures 1, 2, 3, 4, 5, 6, 7:
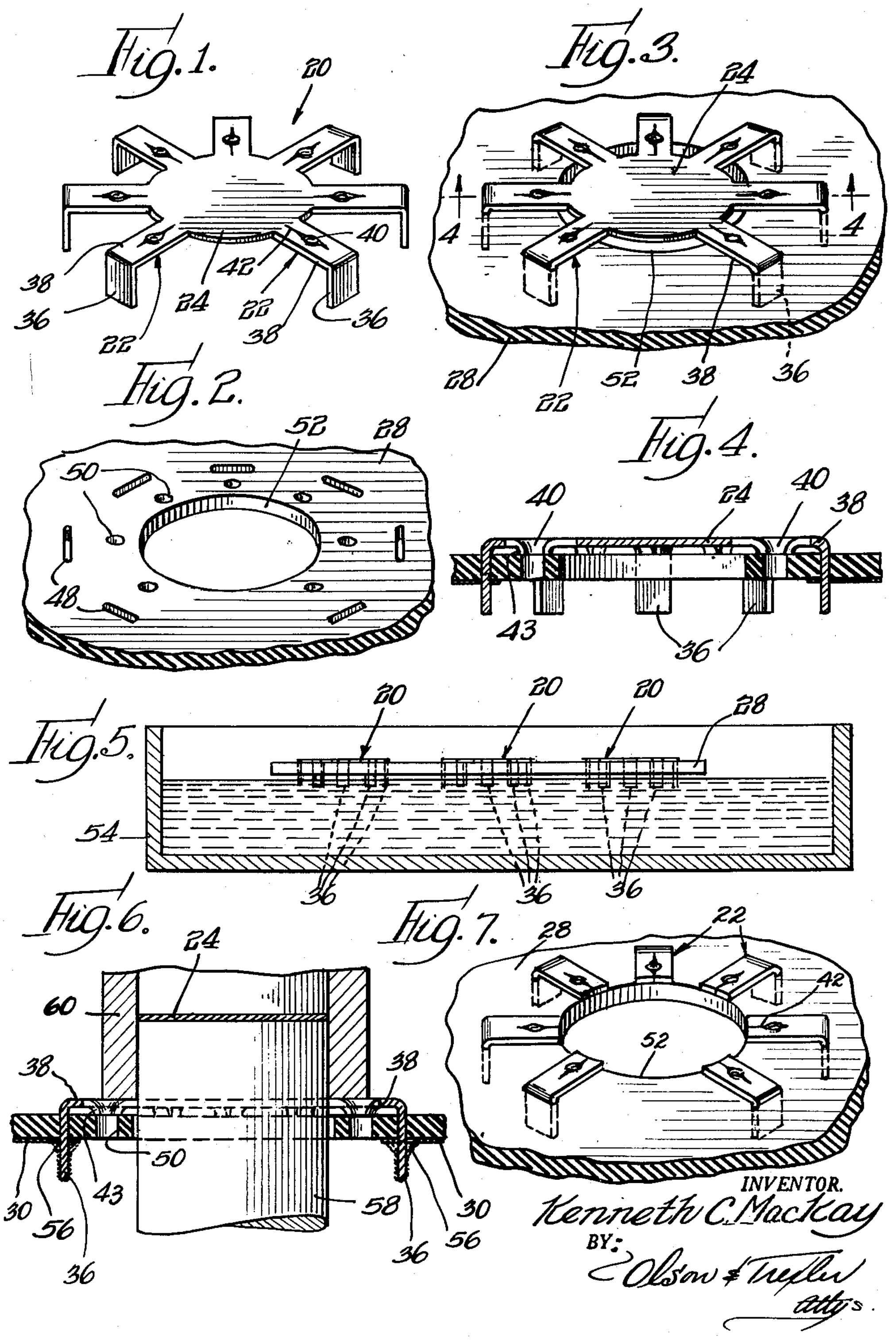
Fig. 1 is a perspective view showing a clip structure embodying the principles of this invention and including a plurality of terminal clip elements which are to be separated from each other after the clip structure has been applied to a panel.
Fig. 2 is a fragmentary perspective view showing a panel to which the clip structure is to be applied.
Fig. 3 is a fragmentary perspective view showing the clip structure applied to a panel.
Fig. 4 is a sectional view taken along line 4—4 in Fig. 3.
Fig. 5 is a fragmentary sectional view showing how the finger portions of the clip elements may be dip soldered after the clip structure is applied to the panel.
Fig. 6 is a fragmentary sectional view showing how the center portion of the clip structure is severed to separate the clip elements.
Fig. 7 is a fragmentary perspective view showing a plurality of the terminal clip elements applied to a panel and separated from each other.
Figures 8, 9, 10, 11, 12, 13, 14, 15, 16:
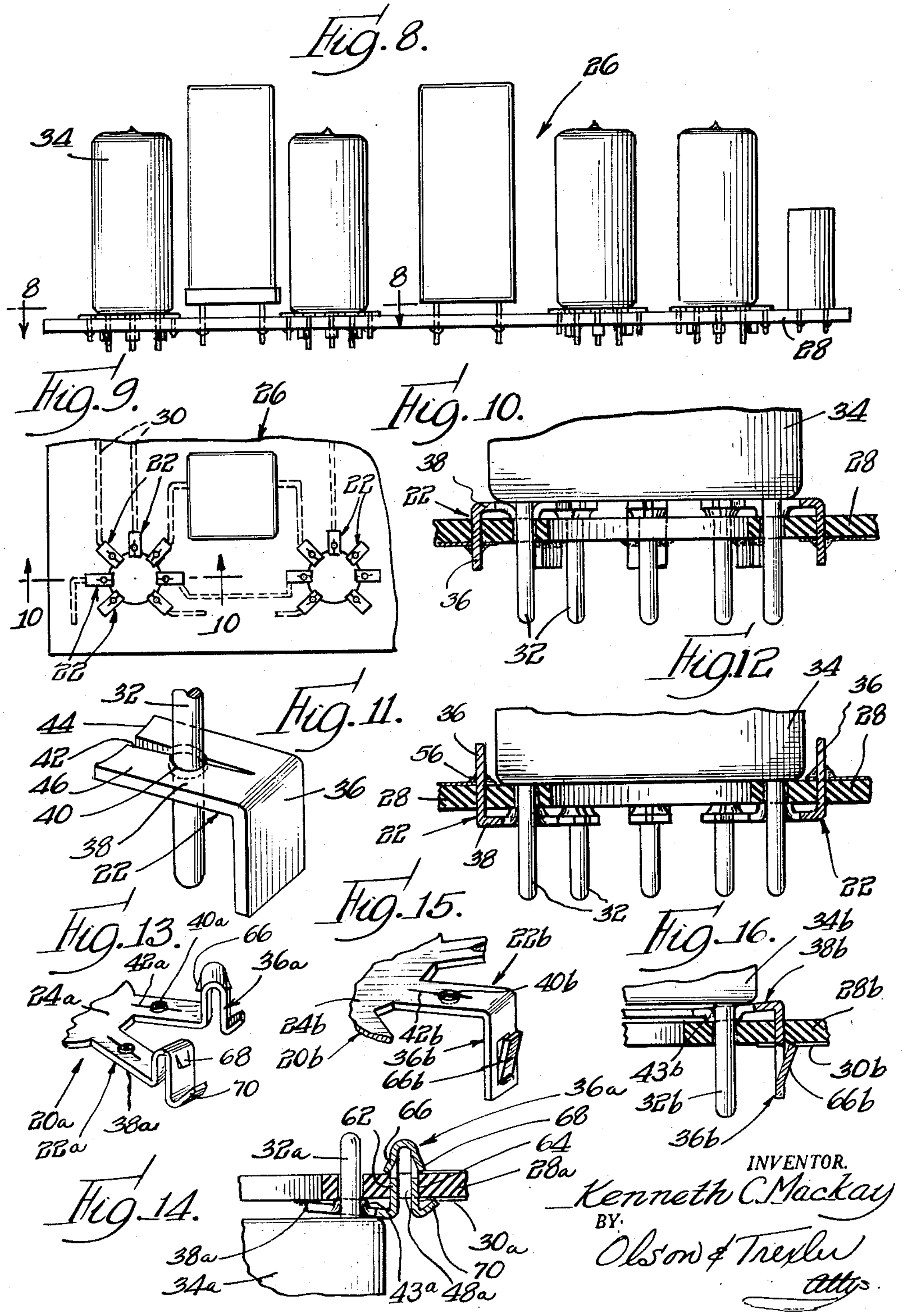

Referring now more specifically to the drawings wherein like parts are designated by the same numerals throughout the various figures, a terminal clip structure 20 embodying the principles of this invention is shown best in Fig. 1. The clip structure 20 is formed from any suitable resilient sheet metal having the desired electrical conductivity characteristics and includes a plurality of individual clip elements 22 which are integrally joined by a connecting section 24. In the particular embodiment shown for the purpose of illustrating the present invention, the structure 20 is provided with seven clip elements 22 for receiving the prongs of a standard radio tube. As shown in Figs. 8 and 9 the terminal clips of this invention are particularly useful in a chassis 26 of a radio or the like having a base or panel member 28 formed from a suitable electrical insulating material such as Bakelite and having circuit elements 30 printed thereon, as will be understood. The terminal clips are mounted on the panel in the manner described below for receiving prongs 32 of tubes 34. However, it will be appreciated that the clips of the present invention may also be arranged for receiving wires or other terminal elements for connecting units in addition to the tubes to the printed circuit.

Each of the clip elements 22 includes a generally axially extending stud or finger portion 36 adapted to project through an opening in the printed circuit panel 28 and a socket portion 38. As shown in Figs. 1, 3, 7 and 11 the socket portion is provided with an aperture 40 through which a terminal wire or prong 32 may be inserted. Preferably, the aperture 40 is formed so that it has a diameter slightly less than the diameter of the prong 32, and a socket portion is slit as at 42 whereby opposing arm sections 44 and 46 are provided which spread apart upon insertion of the prong 32 through the aperture and resiliently grip the prong. If desired, the aperture 40 may be formed so that it is defined by a short cylindrical section 43 as shown in Figs. 4 and 10 so as to increase the area of contact between the clip and the prong.

In Fig. 2 the manner of preparing the circuit panel 28 for receiving the clip structure 20 is shown. More specifically, a panel is provided with a plurality of circularly arranged slots 48 for receiving the stud or finger portions of the clip elements and a plurality of apertures 50 adapted to align with the apertures 40 of the clip element socket portions. The panel 28 is also provided with a large aperture 52 which is centrally disposed with respect to the openings or slots 48 and the apertures 50 and which has a diameter at least as great as the diameter of the clip structure connecting section 24.

In accordance with one embodiment of the present invention, the clip elements 22 are mounted on the circuit panel in the following manner. A plurality of integrally connected clip elements 22 and the panel are first formed in the manner shown in Figs. 1 and 2. Then the stud or finger portions of the clip elements are simultaneously inserted through the openings 48 in the panel as shown in Figs. 3 and 4. Then the under surface of the panel 28 is lowered to the surface of a molten solder bath 54 as shown in Fig. 5 so that the projecting free ends of the clip finger portions are dipped into the solder. It should be noted that the socket portions of the clip elements are formed so that they terminate or are located well above the surface of the solder bath whereby any possibility of the socket portions becoming clogged with solder is eliminated. Upon removal of the circuit panel 28 from the solder bath, a mass 56 of solder will adhere to each clip finger portion as shown in Fig. 6 and provides an electrical connection between the finger portion and an element of the printed circuit. Then, as shown in Fig. 6, the central connecting section 24 of the clip structure is separated from each of the clip elements by means of a suitable punch 58 and a cooperating die 60. As a result the individual clip elements 22 are separated from each other as shown in Fig. 7. With the structure and method described above, it will be appreciated that considerable savings in time and labor may be effected since a number of clip elements are simultaneously applied to the panel as a unit whereby individual handling of each clip element is eliminated, and since the socket portions are formed so as to preclude the entry of solder therein.

The terminal clips may be mounted so that their socket portions overlie the circuit panel as shown in Fig. 10, but in certain installations, they may be mounted so that their socket portions underlie the panel as shown in Fig. 12. Since it is often more difficult to withdraw the tube prongs from the clip socket portions than it is to insert the prongs, the arrangement shown in Fig. 12 has an advantage in that the panel 28 serves to back up the clip socket portions and prevent them from bending during removal of the tube.

In Figs. 13 and 14 there is shown a modified form of the present invention wherein the clip structure is similar to the above described clip structure as indicated by the application of identical reference numerals with the suffix "*a*" added to corresponding elements. This embodiment differs in that the stud or finger portion 36*a* of each clip element has been modified so as to eliminate the need for solder either to secure the clip element to the panel or to establish an electrical connection between the clip element and an element 30*a* of the printed circuit. More specifically, the stud portion 36*a* is reversely bent so that it has a pair of sections 62 and 64 adapted to project through the opening or slot in the panel. Resilient lugs 66 and 68 are struck from the sections 62 and 64 respectively for engaging the side of the panel opposite from the socket portion 38*a* in order to retain the clip element and the panel in assembled relationship. A free end 70 of the section 64 is turned for contacting the element 30*a* of the printed circuit. The socket portion 38*a* and the end section 70 are inclined with respect to the axis of the stud portion in the manner shown in Fig. 14 and are formed so that they must be flexed toward positions normal to the axis of the stud portion before the lugs 66 and 68 can be passed entirely through the panel. Thus, the inherent resiliency of the material causes the panel to be gripped tightly between the lugs and the portions 38*a* and 70 whereby a secure electrical connection is maintained between the section 70 and the circuit element 30*a*. It is understood that in the embodiment of Figs. 13 and 14, a plurality of the clip elements which are integrally connected will be applied to the panel as a unit and subsequently separated from each other in the manner described above. While in Fig. 14 the clip element is shown applied to the under surface of the panel for supporting an inverted tube, it will be appreciated that the clip element may also be applied to the upper surface of the panel for supporting an upright tube.

The clip element 22*a* is especially useful in installations wherein it is desired to mount the tube on the same side of the panel as the circuit element 30*a* to which the clip is to be electrically connected. In addition, the lugs 66 and 68 may be utilized to establish an electrical connection with circuit elements on the opposite side of the panel. However, in certain installations it is desirable to mount the tube at the side of the panel opposite from the side on which the circuit element to be connected with the clip is located, and in such installations, the clip structure 20*b* shown in Figs. 15 and 16 may be used. This embodiment is similar to the embodiment of Figs. 13 and 14 except that the stud portion 36*b* is provided with only a single section and a single lug 66*b* which is adapted to contact a circuit element 30*b*.

While the preferred embodiments of the present invention have been shown and described herein, it is obvious that many structural details may be changed without departing from the spirit and scope of the appended claims.

The invention is claimed as follows:

1. A one-piece sheet metal terminal clip structure comprising a central body portion, a plurality of socket portions integrally joined to an outer peripheral edge of and circumferentially spaced on and projecting generally radially outwardly from said body portion for receiving terminal elements, and a plurality of stud portions respectively connected with margins of said socket portions spaced radially outwardly from said central body portion and extending generally axially from said socket portions for insertion into openings in a panel member, said body portion being separable and removable in one piece from said socket portions when the clip structure is applied to the panel member to leave a plurality of separate terminal clips on the panel member.

2. A one-piece sheet metal terminal clip structure comprising a central body portion, a plurality of integral radially outwardly extending socket portions spaced circumferentially on said body portion for receiving terminal elements, each of said socket portions having means defining a terminal element accommodating aperture intermediate its opposite ends and radial slit means extending from adjacent said body portion and traversing said aperture means for enabling the socket means resiliently to grip and substantially encircle a terminal element to be inserted therein, and a plurality of generally parallel axially extending stud portions respectively connected with said socket portions for insertion through openings in a panel member, said body portion being separable and removable from said socket portions when said clip structure is applied to a panel member to leave a plurality of separate terminal clips on the panel member.

3. A one-piece sheet metal terminal clip structure for application to an electrical circuit panel member having a plurality of openings therethrough comprising a planar body portion, a plurality of socket elements integral with and extending laterally in spaced relationship from said body portion for receiving terminal elements, each of said socket elements having a portion at least partially defining a terminal element receiving means projecting axially in one direction from the plane of said body portion and engageable with one side of the panel member when the clip structure is applied to the panel member, and a plurality of stud portions respectively connected with said socket elements and extending axially in said one direction for projecting from said one side of said panel member through said openings and beyond an opposite side of the panel member when the clip structure is applied to the panel member, said socket elements being disposed at said one side of the panel member and terminating short of said opposite side when the clip structure is applied to the panel member to facilitate application of solder or the like to the stud portions projecting beyond said opposite side without clogging the socket elements.

4. A one-piece sheet metal terminal clip structure for application to an electrical circuit panel member having a plurality of openings therethrough comprising a central body portion, a plurality of socket portions integral with and extending laterally outwardly in spaced relationship from said body portion for receiving terminal elements, said socket portions being disposed at one side of the panel member when the clip structure is applied to the panel member, a plurality of substantially axially disposed stud portions respectively connected with said socket portions and extending in one direction for insertion through said openings, each of said stud portions including a resilient laterally projecting element spaced from said socket portions and adapted to be snapped through a panel member aperture for engagement with an opposite side of said panel member for retaining the clip structure in assembled relationship with the panel member, and means for electrically connecting the clip structure with a circuit element on the panel member.

5. A terminal clip structure, as defined in claim 4, wherein said last named means comprises an element on each stud portion and located adjacent an associated socket portion for contacting a circuit element at the same side of the panel member as said socket portion.

6. A terminal clip structure, as defined in claim 4, wherein said last named means comprises an element on each of said stud portions and spaced axially from an associated socket portion for contacting a circuit element at a side of said panel member opposite from the socket portion.

References Cited in the file of this patent

UNITED STATES PATENTS

| | | |
|---|---|---|
| 2,581,967 | Mitchell | Jan. 8, 1952 |
| 2,599,488 | Sampson | June 3, 1952 |
| 2,606,985 | De Bell | Aug. 12, 1952 |
| 2,694,249 | Kapp | Nov. 16, 1954 |
| 2,716,268 | Steigerwalt | Aug. 30, 1955 |

FOREIGN PATENTS

| | | |
|---|---|---|
| 661,989 | Great Britain | Nov. 28, 1951 |